US006691052B1

(12) United States Patent
Maurer

(10) Patent No.: US 6,691,052 B1
(45) Date of Patent: Feb. 10, 2004

(54) APPARATUS AND METHODS FOR GENERATING AN INSPECTION REFERENCE PATTERN

(75) Inventor: Wilhelm Maurer, San Jose, CA (US)

(73) Assignee: KLA-Tencor Corporation, San Jose, CA (US)

(*) Notice: Subject to any disclaimer, the term of this patent is extended or adjusted under 35 U.S.C. 154(b) by 201 days.

(21) Appl. No.: 10/061,632

(22) Filed: Jan. 30, 2002

(51) Int. Cl.⁷ .......................... G01N 37/00; G06F 19/00
(52) U.S. Cl. ........................................... 702/81
(58) Field of Search .......................... 702/81, 85, 108; 382/144, 145; 716/19, 21; 250/311, 307, 310; 356/511, 904, 451; 700/117, 121; 316/237, 237.4, 237.5

(56) References Cited

U.S. PATENT DOCUMENTS

| | | | |
|---|---|---|---|
| 4,442,361 A | 4/1984 | Zasio et al. | 250/491.1 |
| 4,890,239 A | 12/1989 | Ausschnitt et al. | 716/21 |
| 5,124,927 A | 6/1992 | Hopewell et al. | 716/21 |
| 5,153,678 A | 10/1992 | Ota | 356/401 |
| 5,444,538 A | 8/1995 | Pellegrini | 356/401 |
| 5,648,854 A | 7/1997 | McCoy et al. | 356/399 |
| 5,654,540 A | 8/1997 | Stanton et al. | 250/237 |
| 5,657,129 A | 8/1997 | Nishi | 356/401 |
| 5,754,299 A | 5/1998 | Sugaya et al. | 356/401 |
| 5,757,480 A | 5/1998 | Shimanaka | 356/237 |
| 5,920,398 A | 7/1999 | Iwanaga et al. | 356/401 |
| 5,989,759 A | 11/1999 | Ando et al. | 430/22 |
| 5,995,234 A | 11/1999 | Nishi | 356/401 |
| 6,064,486 A | 5/2000 | Chen et al. | 356/401 |
| 6,100,985 A | 8/2000 | Scheiner et al. | 356/381 |
| 6,141,108 A | 10/2000 | Kida et al. | 356/401 |
| 6,298,470 B1 | 10/2001 | Breiner et al. | 716/4 |
| 6,304,999 B1 | 10/2001 | Toprac et al. | 716/4 |
| 6,444,373 B1 * | 9/2002 | Subramanian et al. | 430/5 |
| 6,581,193 B1 * | 6/2003 | McGhee et al. | 716/4 |
| 6,606,159 B1 * | 8/2003 | Hill | 356/491 |
| 2002/0026626 A1 * | 2/2002 | Randall et al. | 716/19 |
| 2002/0051566 A1 * | 5/2002 | Yamashita | 382/151 |
| 2002/0133801 A1 * | 9/2002 | Granik et al. | 716/21 |
| 2003/0132382 A1 * | 7/2003 | Sogard | 250/311 |

* cited by examiner

Primary Examiner—Bryan Bui
Assistant Examiner—Demetrius Pretlow
(74) Attorney, Agent, or Firm—Beyer, Weaver & Thomas LLP; Mary R. Olynick, Esq.

(57) ABSTRACT

Disclosed are methods and apparatus for generating reference images to reduce the number of false defects found when comparing a reference image to a corresponding target image of a reticle or mask (or integrated circuit). In one specific implementation, parameters that characterize the reticle making process are collected from a representative reticle or reticle. These parameters are collected (e.g., measured) from a reticle prior to inspection of the reticle. The collected parameters are then used to simulate process effects on the reference images of the design data. After the layout data is altered to simulate process effects and represent a "real" layout after it has been fabricated into a mask, this "real" layout data is then altered again to simulate imaging effects. The resulting reference images now include both processing and imaging effects and may then be used during an inspection of a corresponding reticle or integrated circuit.

34 Claims, 8 Drawing Sheets

APPARATUS AND METHODS FOR GENERATING AN INSPECTION REFERENCE PATTERN

BACKGROUND OF THE INVENTION

The present invention relates generally to reticle and integrated circuit design and fabrication systems. More specifically, the invention relates to mechanisms for inspecting reticles and integrated circuits.

Generation of reticles and subsequent optical inspection of such reticles have become standard steps in the production of semiconductors. Initially, circuit designers provide circuit pattern data, which describes a particular integrated circuit (IC) design, to a reticle production system, or reticle writer. The circuit pattern data is typically in the form of a representational layout of the physical layers of the fabricated IC device. The representational layout typically includes a representational layer for each physical layer of the IC device (e.g., gate oxide, polysilicon, metallization, etc.), wherein each representational layer is composed of a plurality of polygons that define a layer's patterning of the particular IC device.

The reticle writer uses the circuit pattern data to write (e.g., typically, an electron beam writer or laser scanner is used to expose a reticle pattern) a plurality of reticles that will later be used to fabricate the particular IC design. A reticle inspection system may then inspect the reticle for defects that may have occurred during the production of the reticles.

A reticle or photomask is an optical element containing transparent and opaque, and/or semi-transparent and phase shifting regions which together define the pattern of coplanar features in an electronic device such as an integrated circuit. Reticles are used during photolithography to define specified regions of a semiconductor wafer for etching, ion implantation, or other fabrication processes. For many modern integrated circuit designs, an optical reticle's features are between about 1 and about 5 times larger than the corresponding features on the wafer. For other exposure systems (e.g., x-ray, e-beam, and extreme ultraviolet) a similar range of reduction ratios also apply.

Optical reticles are typically made from a transparent medium such as a borosilicate glass or quartz plate on which is deposited on an opaque and/or semi-opaque layer of chromium or other suitable material. However, other mask technologies are employed for e-beam exposure (e.g., stencil masks), x-ray exposure (e.g., absorber masks), etc. The reticle pattern may be created by a laser or an e-beam direct write technique, for example, both of which are widely used in the art.

After fabrication of each reticle or group of reticles, each reticle is typically inspected by illuminating it with light emanating from a controlled illuminator. An optical image of the reticle is constructed based on the portion of the light reflected, transmitted, or otherwise directed to a light sensor. Another way to inspect a reticle is accomplished by directing a beam of electrons from a scanning electron microscope towards the reticle. An image of the reticle is constructed based on secondary and backscattered electrons emitted from the reticle in response to the beam of electron towards a detector. Such inspection techniques and apparatus are well known in the art and are embodied in various commercial products such as many of those available from KLA-Tencor Corporation of San Jose, Calif.

During a conventional inspection process, a target image of a test structure on the reticle is typically compared to a reference image. The reference image is either generated from the circuit pattern data or from an adjacent die on the reticle itself. Either way, the target image features are analyzed and compared with corresponding features of the reference image. Each feature difference is then compared against a threshold value. If the target image feature varies from the reference feature by more than the predetermined threshold, a defect is defined. Similar techniques may be utilized to inspect an integrated circuit (IC).

Unfortunately, these inspection mechanisms frequently result in false defects when the target images significantly differ from their corresponding reference images and these differences are not caused by "real" defects. Several different effects may contribute to the target images differing from the reference images. When the target structures are fabricated from a set of original design patterns which are also used as the reference images, the fabrication process itself introduces discrepancies between the target structures and the reference images. By way of examples, the target structures may become tapered and reduced in size. Target structure corners may also become rounded and/or warped, while edges may become roughened. Imaging of the target structures during inspection also introduces discrepancies between the reference and target images. The imaging process may result in edge enhancement, scan persistence, and contrast changes between the substrate and material, as compared with the design patterns (or reference images). Edges may also appear thickened and charge shadowing may occur.

One technique for reducing the number of false defects includes altering the reference image until it begins to look like the target image. Several parameters of the reference image are typically changed in an iterative process until the reference image resembles the target image. This iterative process is typically complex and time consuming. Although this iterative process may result in a reference image that resembles the target image, it may also unintentionally add a feature to the reference image that corresponds to a "real" defect in the target image. Since a defect is defined as a difference between the reference image and the target image and the reference image has been alter to resemble the target image, this technique may cause "real" defects to not be found.

Accordingly, there is a need for improved mechanisms for providing reference images for inspecting corresponding target images so that real defects may be reliable found, while filtering out false defects. Additionally, there is a need for reduction in the discrepancies between the reference and corresponding target images caused by process and/or imaging effects resulting from fabricating and imaging of the corresponding test structures.

SUMMARY OF THE INVENTION

Accordingly, mechanisms are provided for generating reference images to reduce the number of false defects found when comparing a reference image to a corresponding target image of a reticle or mask (or integrated circuit). In one specific implementation, parameters that characterize the reticle making process are collected from a representative reticle or reticle. (The terms "reticle" and "mask" are used herein interchangeably). These parameters are collected (e.g., measured) from a reticle prior to inspection of the reticle. For example, a scanning electron microscope is used to measure and collect parameters from a fabricated reticle that characterize the fabrication process. The collected parameters are then used to simulate process effects on the reference images of the design data that is used to fabricate the reticles for an integrated circuit. Any suitable parameters may be collected from the reticle so as to sufficiently characterize the reticle making process so that these parameters may be used to simulate the effects of the reticle making process on the layout design data or reference representations so that the number of detected "false" defects is reduced. After the layout data (or reference representations) is altered to simulate process effects and represent a "real" layout after it has been fabricated into a mask, this "real" layout data is then altered again to simulate imaging effects. The resulting reference images now include both processing and imaging effects and may then be used during an inspection of a corresponding reticle or integrated circuit. These techniques may also be used for inspecting an integrated circuit.

The techniques of the present invention provide a reference image that results in significantly less "false" defects during inspection of a corresponding target image than a conventional produced reference image. In specific embodiments, the techniques of the present invention also provide a clear separation between effects resulting from the fabrication process and the inspection process. Thus, the effects from new techniques for fabrication or inspection can be more quickly and efficiently adapted into the separate techniques for generating a reference image.

In one embodiment, a method of generating a reference image for an inspection tool is disclosed. A plurality of parameters that characterize a process for fabricating a sample are collected. A first reference representation that is designed to be used to fabricate a target structure on the sample is provided. The first reference representation is altered based on the collected parameters so as to produce a second reference representation that simulates process effects from fabricating the sample sufficiently well so as to reduce detection of false defects during a subsequent inspection of the sample using the first reference representation. The second reference representation is altered so as to simulate imaging effect from imaging the second reference representation with the inspection tool. The altering of the first and second reference representations to simulate process and imaging effects, respectively, results in a simulated reference image that may be compared against the target structure to determine whether the target structure has any defects.

In a specific implementation, the first reference representation is altered to simulate process effects by inputting the first reference representation and the collected parameters that characterize a process for fabricating a sample into a process simulation tool which thereafter simulates the process effects by altering the first reference representation. In a further implementation, the target structure is imaged to obtain a target image. The simulated reference image is compared to the target image. When there is a difference between the simulated reference image and the target image, it is determined that there is a defect present within the target structure. In one aspect, the collection of the parameters is performed independently of the comparison. In a specific aspect, collection of the parameters is performed with a scanning electron microscope and the imaging of the target structure is performed with an optical inspection tool.

In another aspect, it is determined whether the collected parameters are within specification. An inspection is performed when the collected parameters are within specification. However, an inspection is not performed when the collected parameters are not within specification. In another embodiment, the process for fabricating the sample is adjusted when the collected parameters are not within specification.

In one aspect, the process effects include feature tapering, corner rounding, and feature shrinkage. In another aspect, the process effects further include feature warping and edge roughening. In one implementation, the imaging effects are based on one or more imaging parameters selected from a group consisting of numerical aperture of the inspection tool's lens, magnification of the inspection tool's lens, and coherence of the inspection tool's illumination.

In a specific embodiment, the inspection tool is an optical inspection tool designed to measure and/or inspect samples. In one aspect, the sample is a reticle or an integrated circuit, and the target structure is an integrated circuit structure, a resist pattern structure utilizable for fabricating an integrated circuit structure, a reticle structure, or a resist pattern structure utilizable for fabricating a reticle structure.

In another aspect, the invention pertains to a inspection system operable to generate a reference image for an inspection tool. The inspection system includes one or more processors and one or more memory. At least one of the processors and memory are adapted to perform one or more of the above described inventive procedures. In one embodiment, the computer system is in the form of an inspection system. In yet another aspect, the invention pertains to a computer program product for generating a reference image for an inspection tool. The computer program product includes at least one computer readable medium and computer program instructions stored within the at least one computer readable product configured to cause a processing device to perform one or more of the above described inventive procedures.

These and other features and advantages of the present invention will be presented in more detail in the following specification of the invention and the accompanying figures which illustrate by way of example the principles of the invention.

DETAILED DESCRIPTION OF SPECIFIC EMBODIMENTS

Figure 1:
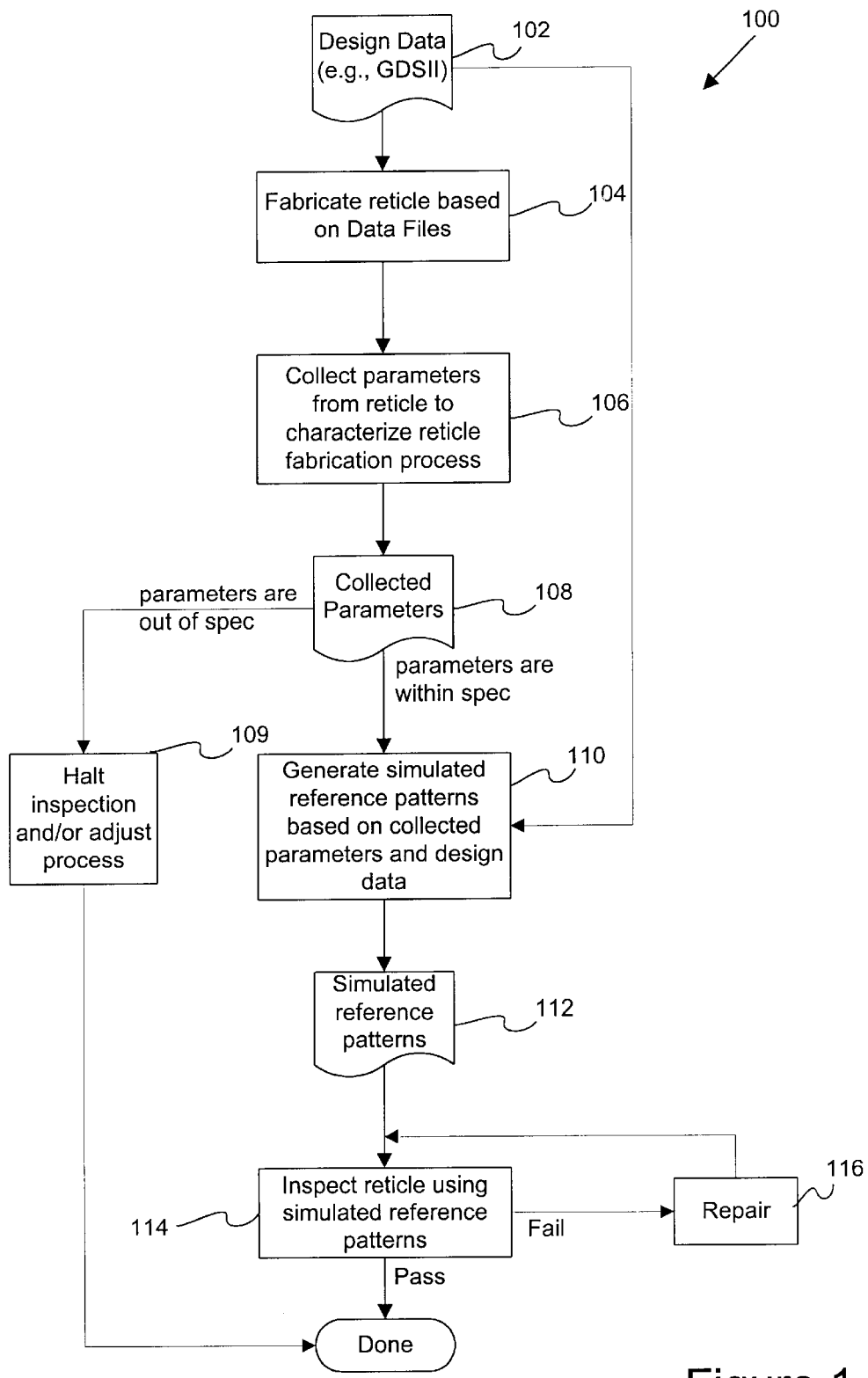
FIG. 1 is a flowchart illustrating a procedure for generating and inspecting a reticle in accordance with one embodiment of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general terms, simulated reference representations are generated. The simulated reference representations typically form part of a recipe. The recipe is designed for use by an inspection tool which is configured to locate and/or inspect structures on a particular sample, such as a reticle or integrated circuit (IC). The reticle or IC contains structures (herein referred to as target structures) that are to be inspected by one or more inspection tools. These target structures may include special test structures or structures that form part of the IC device.

The recipe includes reference images that correspond to at least some of the target structures on the sample. Each reference image is altered from the original design feature to simulate one or more process effects that occur on the corresponding target structure during fabrication of the target structure. That is, the process effects result in differences between the target structure and its intended design. For example, corners of a design representation of a particular target structure are sharp and corners of the corresponding fabricated target structure are rounded. The process effects are simulated based on parameters that characterize the fabrication process. These parameters are collected (e.g., measured) from a fabricated sample prior to inspection of such sample. For example, a scanning electron microscope is used to measure and collect parameters from a fabricated sample that characterize the fabrication process. The collected parameters are then used to simulate process effects on the reference images.

The altered reference images are then altered to simulate imaging effects introduced during imaging of the corresponding target structures during the inspection. In brief, the imaging effects result in the target image differing from the target structure that is being imaged. When target structures are imaged with an optical inspection tool, for example, the act of forming a target image from the target structure introduces imaging effects. Techniques for simulating imaging effects are well known to those skilled in the art.

The simulated reference images may be used to locate and/or inspect corresponding target structures. During inspection, each target structure on the sample is compared with a corresponding simulated reference structure. More specifically, an image of the target structure is compared to the simulated reference image. When there is a difference present between the two images, it is determined that the target structure has a defect. This difference may have to be above a predetermined threshold to indicate a defect.

Some of the simulated reference images may also be used to accurately locate corresponding images of target structures on a sample during imaging of such sample. Once a corresponding target image is located, a measurement (e.g., gate width) of the found target image or another target image located proximate to the initially found target image may then be taken and compared to a measurement of a reference image (e.g., a reference image derived from the design database that corresponds to the target image being tested or an adjacent die image). The target image is used by pattern recognition software, for example, to locate a target structure that is proximate to the actual test structure that is to be inspected. Alternatively, the target structure may be the test structure itself.

FIG. 1 is a flowchart illustrating a procedure 100 for generating and inspecting a reticle in accordance with one embodiment of the present invention. Initially, one or more electronic design file(s) or design data 102 that represent a particular integrated circuit (IC) design are provided. These design file(s) or design data may be in any suitable format. By way of specific examples, the design files may have a GDSII format or MEBES™ format available from ETEC, a division of Applied Materials of Sunnyvale, Calif.

Any suitable design techniques may be used to generate the design files. In one common technique, an IC designer uses preexisting schematic library blocks to form the IC device using, for example, electronic design automation (EDA) tools. In some cases, the IC designer may create the IC device or part of the IC device from scratch with the aid of any suitable design system, such as conventional computer aided design (CAD) tools. For instance, the IC designer may use a schematic CAD tool to plan the logic diagrams for a particular IC device. Still further, the IC designer may write a description of the IC device or portions of the IC device with the aid of a hardware design language, such as VHDL.

Next, the IC designer generates a circuit pattern database (commonly referred to as a "layout") from the IC design. The circuit pattern database is composed of a plurality of electronic representations of layout patterns for IC layers that are later converted into a plurality of reticles that are used to fabricate a plurality of physical layers of an IC device. Each physical layer of the fabricated IC device corresponds to one of the reticles and an associated one of the electronic representations of the circuit pattern database. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. Each electronic representation is composed of a plurality of polygons or other shapes, which together define the reticle pattern.

The circuit pattern database (referred to herein as design data or files) may be generated using any suitable technique, for example, by using EDA or CAD tools. In one technique, the IC designer may manually lay out the circuit patterns for the IC device with or without preexisting library cells. Alternatively, a synthesis tool may automatically create circuit patterns for the IC device from scratch or by piecing together preexisting library cells.

Figure 2:
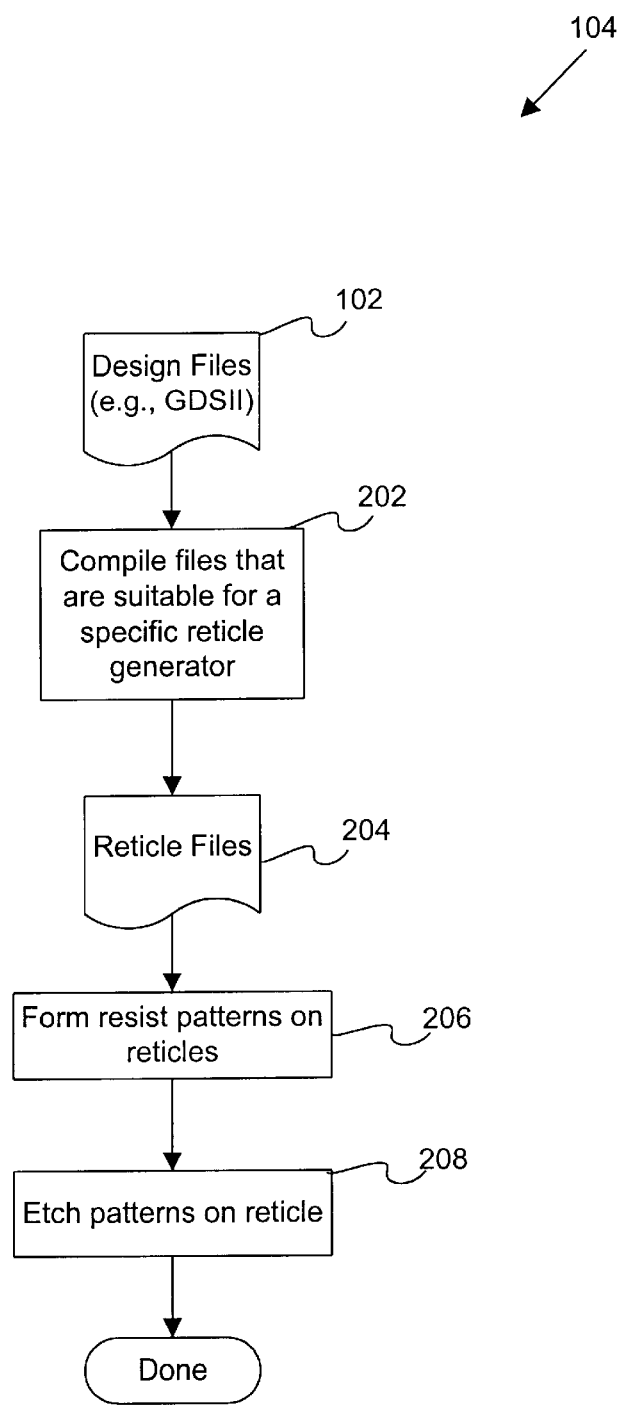
FIG. 2 is a flowchart illustrating the operation of FIG. 1 of fabricating a reticle in accordance with one embodiment of the present invention.

The design data 102 is then used to fabricate a number of reticles in operation 104. Any suitable technique for fabricating reticles may be utilized. FIG. 2 is a flowchart illustrating the operation of FIG. 1 of fabricating a reticle in accordance with one embodiment of the present invention. Initially, the design files 102 are transcribed into a file format 204 that is suitable for reticle fabrication in operation 202. By way of examples, file formats that are suitable for reticle generation include a MEBES jobdeck. The above described CATS software may be used to generate the MEBES jobdeck. The reticle files 204 are then used to form resist patterns on reticles in operation 206. The reticles may then be etched in operation 208 to form patterns on the reticle. The resist may also be removed to form a patterned reticle in operation 208.

As discussed further below, simulated reference patterns may be utilized during various stages of the reticle and IC fabrication process 200 to locate and inspect structures. For example, the resist patterns produced from operation 206 may be tested using reference patterns that simulate resist process effects and resist imaging effects, where the reference patterns are used to locate unique resist patterns proximate to the test structures and/or inspect test structures. The reticle patterns produced from operation 208 may also or alternatively be tested. Reference patterns that simulate reticle pattern fabrication effects (e.g., etching effects) and inspection imaging effects may then be utilized to locate the reticle patterns and/or inspect test structures. The reticles are typical used to fabricate an integrated circuit (not shown). The integrated circuit (IC) may also be inspected using simulated reference patterns. For instance, reference patterns that simulate IC process effects and imaging effects may be utilized during this inspection.

Referring back to FIG. 1 after the reticles are generated, parameters that characterize the process for fabricating the reticle are collected from the reticle in operation 106. These collected parameters 108 may be stored in one or more data bases that are accessible by the any number and type of inspection tools. The collected parameters may have been measured from the sample in a previous or concurrent step. Any suitable parameter that changes during fabrication of such reticle may be measured on the reticle. Several relevant parameter types are described further below.

Optionally, it may be determined next whether the collected parameters are within a predetermined set of specifications. If the collected parameters are not within specification, the inspection process may be halted and/or the process for fabricating the sample altered so as to achieve a sample that is within specification in operation 109. In one embodiment, a scanning electron microscope is used to collect the parameters from the fabricated reticle prior to inspection of such reticle. Critical dimension measurements may also be performed prior to inspection. Since reticle inspection has a significantly lower associated cost than SEM metrology, this embodiment of the invention may have associated cost savings when "bad" reticles are caught during the collection of parameters, rather than during inspection. That is, one may define limits to the collected parameters beyond which a reticle may not move on to the inspection procedure.

If it is determined that the collected parameters are within specification or a determination is not made, simulated reference patterns 112 are then generated based on the collected parameters and design data in operation 110. The reticle is then inspected using the simulated reference patterns in operation 114. If the reticle passes inspection, the procedure 100 for generating and inspecting a reticle ends. However, if the reticle fails inspection, the reticle may be repaired in operation 116 and inspected again. Alternatively, the reticle may be recycled or thrown out and a new reticle is then fabricated.

Figure 3:
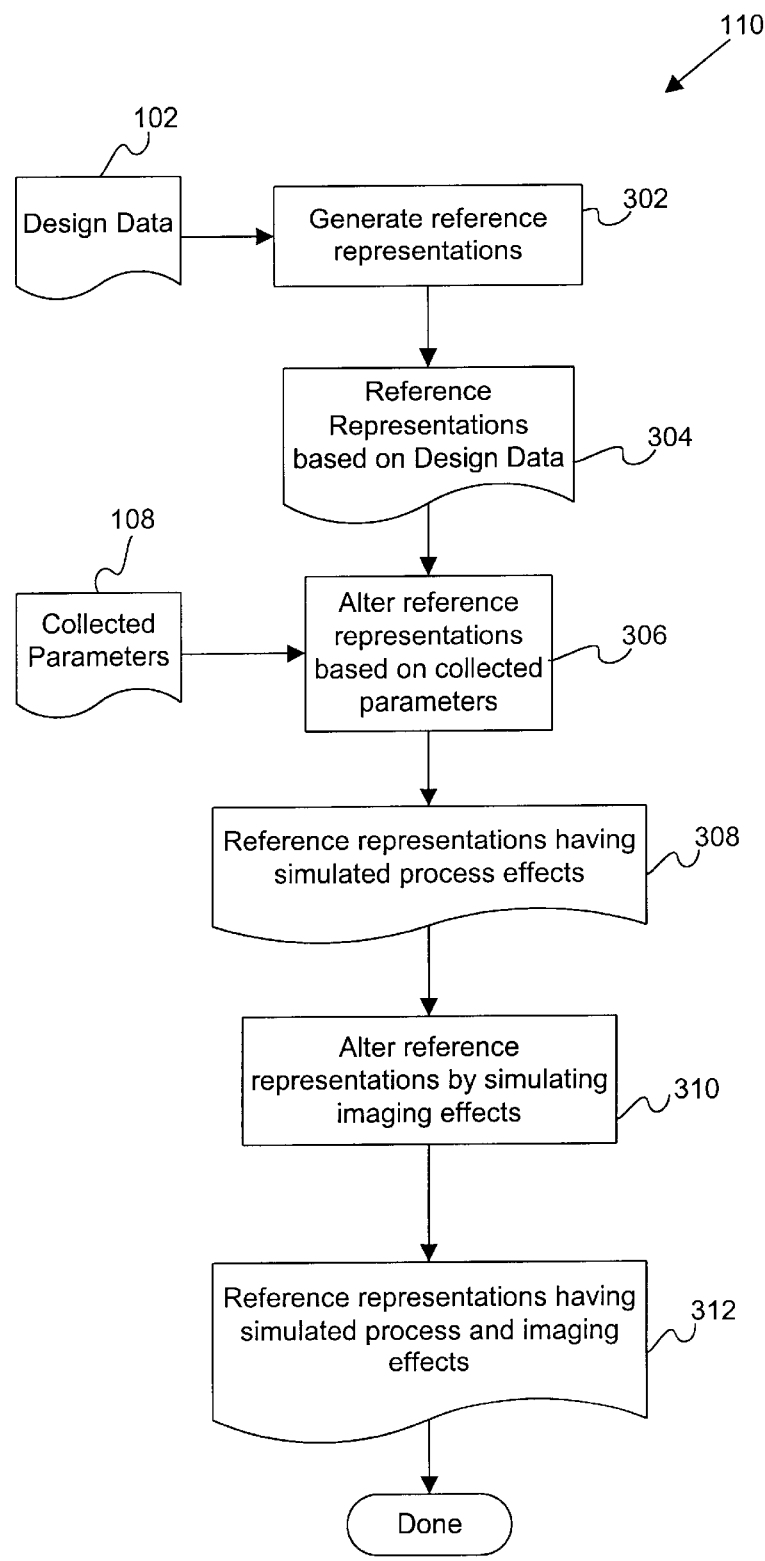
FIG. 3 is a flowchart illustrating the operation of FIG. 1 for generating simulated reference patterns in accordance with one embodiment of the present invention.

FIG. 3 is a flowchart illustrating the operation 110 of FIG. 1 for generating simulated reference patterns in accordance with one embodiment of the present invention. Initially, a plurality of reference representation are generated from the design data 102 in operation 302. The reference representations may be compiled from the design data in any suitable manner. In one embodiment, the design data is used to compile files that are suitable for a particular recipe generator. In one implementation, the design files are presented graphically to an operator so that the operator may select unique reference patterns that may later be used to locate a target pattern that is proximate to the test structure itself. In a specific implementation, files suitable for specific recipe generators, as well as files suitable for specific fabrication protocols, may be generated using CATS™ software available from Transcription Enterprises, a division of Numerical Technologies of Los Gatos, Calif.

The resulting files may include bitmaps of reference structures that correspond to unique target structures that are located prior to testing proximate test structures. The resulting files may also include bitmaps of a reference structure that is to be compared to an image of the corresponding test structure. The resulting files may also include information that is used to specify how to locate the proximate test structure and/or how to test the proximate test structure. In one embodiment, the resulting files contain text files that indicate the start of each target image bitmap, an offset from each target structure to the actual test structure, a test structure type, and a measurement type. In a specific implementation, the specified test structure types include a post, a hole, a line or a trench. The measurement type specifies whether to measure an imaged test structure between the outer edges or the inner edges. The measurement type may also indicate a threshold value for such measurement.

A recipe is then generated from the bitmaps and text files for a specific type of inspection tool. That is, the original reference representations may form part of an inspection recipe. In one embodiment, a recipe for a specific inspection tool is generated based on one or more recipe templates and bitmap patterns and text files which are based on the original design data 102. The bitmap patterns each represent a reference pattern which can be used to locate and/or inspect a corresponding target pattern on the sample. The template is used to create a sequence of search and/or inspection steps. Each search or inspection step utilizes at least one of the bit map or reference patterns to locate and/or inspect a corresponding target structure. The resulting inspection tool recipe includes a plurality of original reference representations 304 that correspond to a plurality of target structures on the sample.

The original reference representations within the inspection tool recipe are then altered into reference representations having simulated process effects 308 based on the collected parameters 108 in operation 306. In a specific implementation, the measurements obtained from the reticle are used to model the process effects onto the original representations 304 to produce reference representations 308.

Any suitable process effects may be simulated using the parameters collected from the reticle. Preferably, the simulated process effects include feature tapering, corner rounding, and feature shrinkage. The simulated process effects may also include feature warping and edge roughening. In one implementation, the simulated imaging effects include substrate and material contrast shifting, edge enhancement, and scan persistence. The simulated imaging effects may also include edge thickening and charge shadowing. When simulating the IC fabrication process, effects resulting from a phase shift mask or mask having sub-resolution features may also be measured and used to simulate fabrication effects on the reference patterns.

The reference representation are then altered again to simulate imaging effects in operation 310. In the illustrated embodiment, this imaging simulation is performed by calculating an aerial image of the corresponding structure representations using relevant parameters of the specific inspection tool. Relevant parameters any inspection tool parameters that affects the image of the target image, as compared with the corresponding target structure itself. By way of examples, the parameters for simulating the imaging of an optical inspection tool may include may include, but are not limited to, wavelength of the inspection beam, numerical aperture, coherence factor, magnification, etc. The process and imaging simulations result in reference patterns having simulated process and imaging effects 312.

This operation 110 of generating simulated reference patterns may also include graphically "marking" reference patterns. A mark on a reference pattern indicates that a specific measurement type is to be performed on a corresponding test structure. The measurement type may correspond to a specific threshold value that the measurement of the test structure is required to not exceed. In other words, the threshold value for particular measurement types may be selectable. For example, a lower threshold may be used for critical dimension measurements, as compared to interconnect thickness measurements. Several embodiments of marking techniques are described in U.S. patent application No. 09/213,744, filed Dec. 17, 1998, by Glasser et al., entitled MECHANISMS FOR MAKING AND INSPECTING RETICLES, which application is incorporated herein by reference for all purposes.

Figure 4:
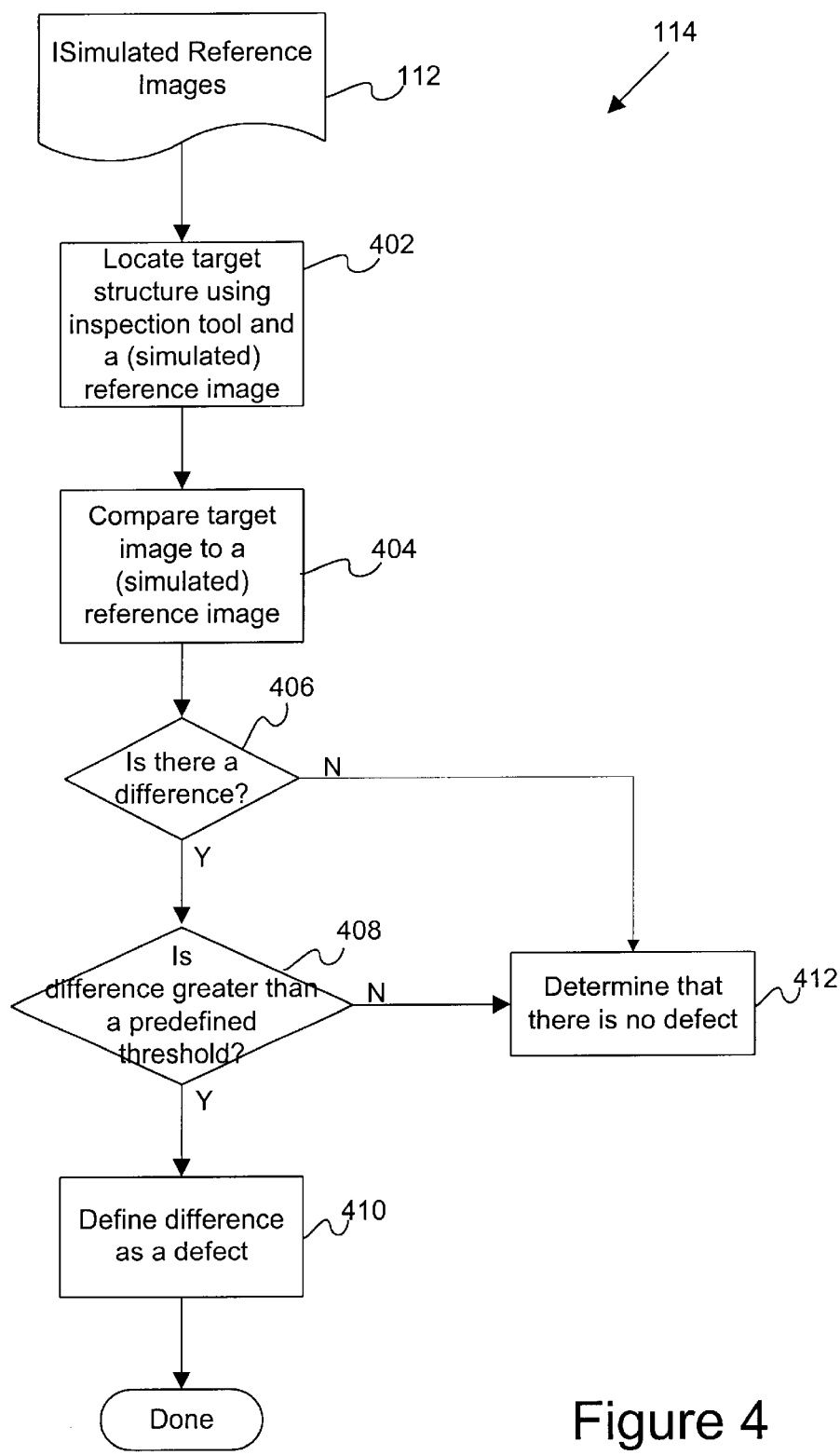
FIG. 4 is a flowchart illustrating a procedure for inspecting a sample in accordance with one embodiment of the present invention.

After a recipe having simulated reference images is generated, the recipe may then be used to inspect a corresponding sample. FIG. 4 is a flowchart illustrating a procedure 400 for inspecting a sample in accordance with one embodiment of the present invention. Initially, the inspection tool may use a reference image within the recipe to locate a corresponding target image in operation 402. The reference image may or may not have reference images that simulate both process and imaging effects.

Any suitable search mechanism may be used to search for a target image that corresponds to the a particular reference image. In one embodiment, a normalized correlation technique is used to measure the pixel-to-pixel similarity between the target image and the reference image, irrespective of any linear differences in brightness. Mathematically, the correlation coefficient r of a reference image and a corresponding target reference image at an offset (u,v) is given by:

$$r(u, v) = \frac{\left[N \sum_i T_i R_i - \left(\sum_i T_i\right)\left(\sum_i R_i\right)\right]}{\sqrt{\left[N \sum_i T_i^2 - \left(\sum_i T_i\right)^2\right]\left[N \sum_i R_i^2 - \left(\sum_i R_i\right)^2\right]}}$$

where N is the total number of pixels, $T_i$ is the target image at $(u+x_i, v+y_i)$, and $R_i$ is the reference image at the relative offset $(x_i, y_i)$.

The found target image (or a proximate target image) are then compared to either the same reference image that was used to locate the target image of a difference reference image in operation 404. The comparison reference image may include simulations of process and imaging effects. In sum, the simulated reference images may be used for one or both searching for a corresponding target image and inspecting the corresponding target image.

After a reference image is compared to the corresponding target image, it is then determined whether there is a difference between the two images in operation 406. If there is no difference, it is determined that there is no defect within the target structure in operation 412. When there is a difference between the reference image and the target image, it may then be determined whether that difference is above a predetermined threshold in operation 408. This threshold may be set so as to filter out differences between the reference and target image that will not result in a device failure. If the difference is above the threshold, the difference is defined as a defect in operation 410.

If there are multiple differences found between the same reference and target images, operations 408 through 412 may be repeated for each difference. Operations 402 through 410 may also be repeated for other target structures on the sample.

As stated above, any suitable type of process effect may be simulated on the reference representations or images of the design data. Likewise, any suitable technique may be used to perform a simulation of the process effects from a particular process based on parameters measured from a sample fabricated with such process. There are several software tools that simulate process effects of a particular reticle generation process or a particular IC device fabrication process. ProBEAM by KLA-Tencor of San Jose, Calif. is an example of a software tool that simulates the reticle making processes, and Solid-C by Sigma-C of Campbell, Calif. is an example of a lithography simulator. Measurements taken from a IC device type sample fabricated with a particular process, process parameters, and the design data representations may be input into an appropriate simulator. The simulator then alters the design data representations to simulate process effects from the particular process based on the measurements and/or process parameters.

Figure 5A:
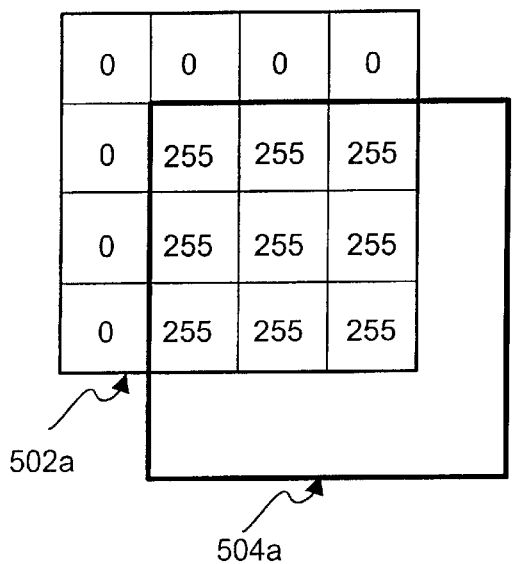
FIGS. 5A and 5B illustrate simulation of corner rounding in accordance with one embodiment of the present invention.
Figure 5B:
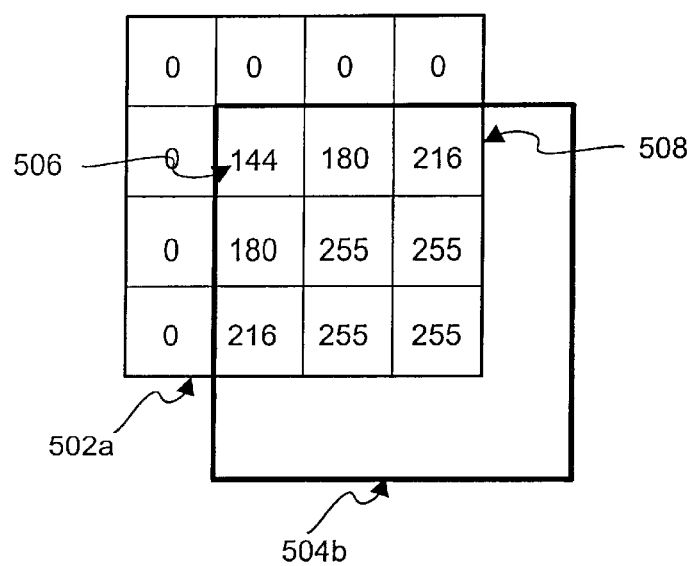

Any suitable technique may be utilized to simulate corner rounding. FIGS. 5A and 5B illustrate simulation of corner rounding in accordance with one embodiment of the present invention. The measurements obtained from a fabricated sample may be used to determine the degree of alteration for various structure types. That is, the alteration examples described below with reference to FIGS. 5A through 7B are described in terms of example degrees of alteration, and the degree of each alteration depends on the measurements obtained from the fabricated sample. For instance, to simulate each type of process effect, it may first be determined which pixels are darkened and how much each pixel is darkened based on measurements obtained from a corresponding sample.

As shown in FIG. 5A, a kernel or window 502a is initially formed around a material or feature corner 502a. In the illustrated embodiment, the kernel is sized to encompass 16 pixels (four pixels wide and four pixels in length). Each pixel can have a brightness level between 0 (darkest) and 255 (brightest). For illustration purposes, the feature pixels have a maximum intensity value of 255 and the substrate pixels have a minimum intensity value of 0. Of course, the imaged feature may have a lower brightness level and may even appear darker relative to the substrate.

After the kernel 502a is centered over the feature corner 502a, the edges of the feature are located by determining where the pixels transition from 255 to 0. The edges of the corner are then darkened so as to simulate corner rounding. In one embodiment, the corner pixel is changed to a intensity value that is an average intensity of the pixels within the kernels. In the illustrated embodiment of FIG. 5B, the corner pixel 506 of the corner pixel 502b is changed to a value of 144. The pixels extending along the edges of the feature from the corner 506 to the edge of the kernel 508 are changed to values that are increasingly less dark than the corner pixel. As shown in FIG. 5B, the pixels adjacent to the corner are changed to values of 180 and the pixels at the edge of the window are changed to values of 216. In this embodiment, each pixel from the corner to the kernel edge are increased in value by a substantially equal amount so that the kernel edge's pixel has a value that is less than the feature's original intensity value by the same equal amount. By gradually darkening the pixels from the edge of the kernel to the corner, the feature corner 502b becomes rounded.

Figure 6A:
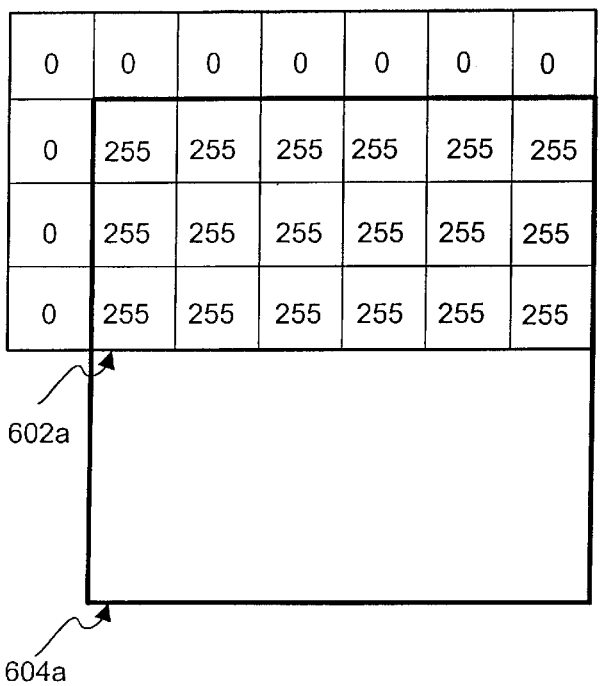
FIGS. 6A and 6B illustrate simulation of feature tapering in accordance with one embodiment of the present invention.
Figure 6B:
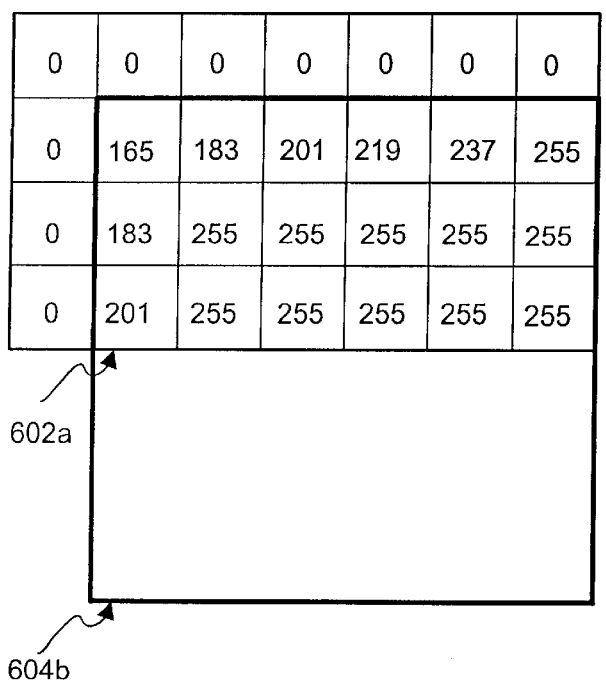

Likewise, any suitable technique may be used to simulate feature tapering. FIGS. 6A and 6B illustrate simulation of feature tapering in accordance with one embodiment of the present invention. The same general techniques are used for simulating feature tapering as shown above for corner rounding. However, the kernel 602a is enlarged, as compared with the kernel for corner rounding. Similar to the corner rounding technique, the corner pixel's intensity value is changed to the average pixel value for the kernel 602a. As shown in FIG. 6B, the corner pixel is changed to a value of 165. The edge pixels are given increasingly larger pixel values that are less dark than the corner pixel. As shown, the edge pixels have values of 183, 201, 219, 237, and 255. That is, the edge pixels are gradually lightened from the corner to the kernel edge.

Figure 7A:
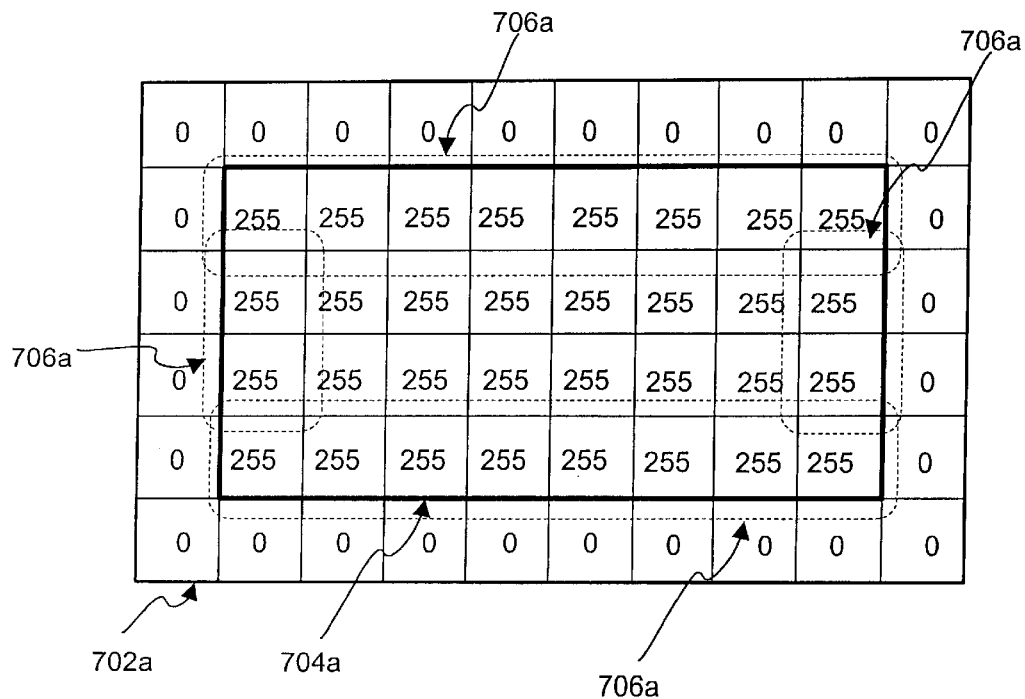
FIGS. 7A and 7B illustrate simulation of feature shrinkage in accordance with one embodiment of the present invention.
Figure 7B:
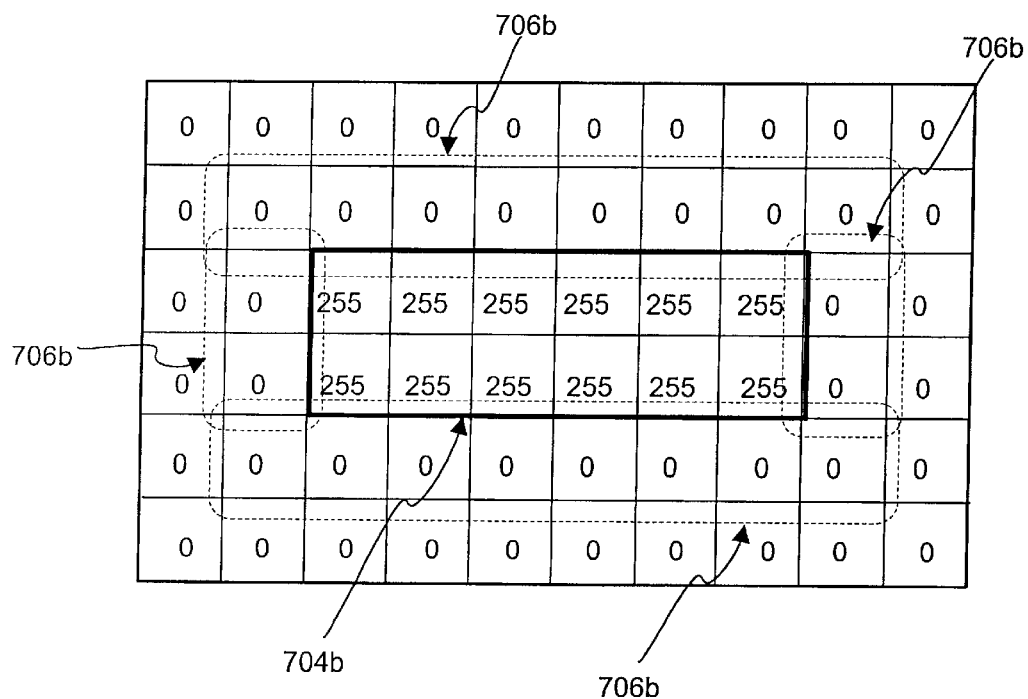

FIGS. 7A and 7B illustrate simulation of feature shrinkage in accordance with one embodiment of the present invention. As shown, in FIG. 7A, a material or feature 704a has a plurality of pixels with a particular intensity (i.e., 255) and a substrate with a different intensity (i.e., 0). The feature 704a has edges 706a. The edges are defined as the pixels that border pixels having a different intensity (i.e., 0). As shown in FIG. 7B, the edge pixels 706b are simply given the same intensity value as the substrate (i.e., 0). As a result of changes to the edge pixels' intensity values, the feature 704b has a smaller size. This same technique may easily be applied to features and substrates having various combinations of intensity values.

Any suitable techniques may be used for simulating imaging effects, which techniques are well known to those skilled in the art. Software tools for simulating optical effects are readily available. By way of examples, imaging simulation tools are available from Mentor Graphics of Wilsonville, Oreg. or Numerical Technologies, Inc of San Jose, Calif.

Figure 8:
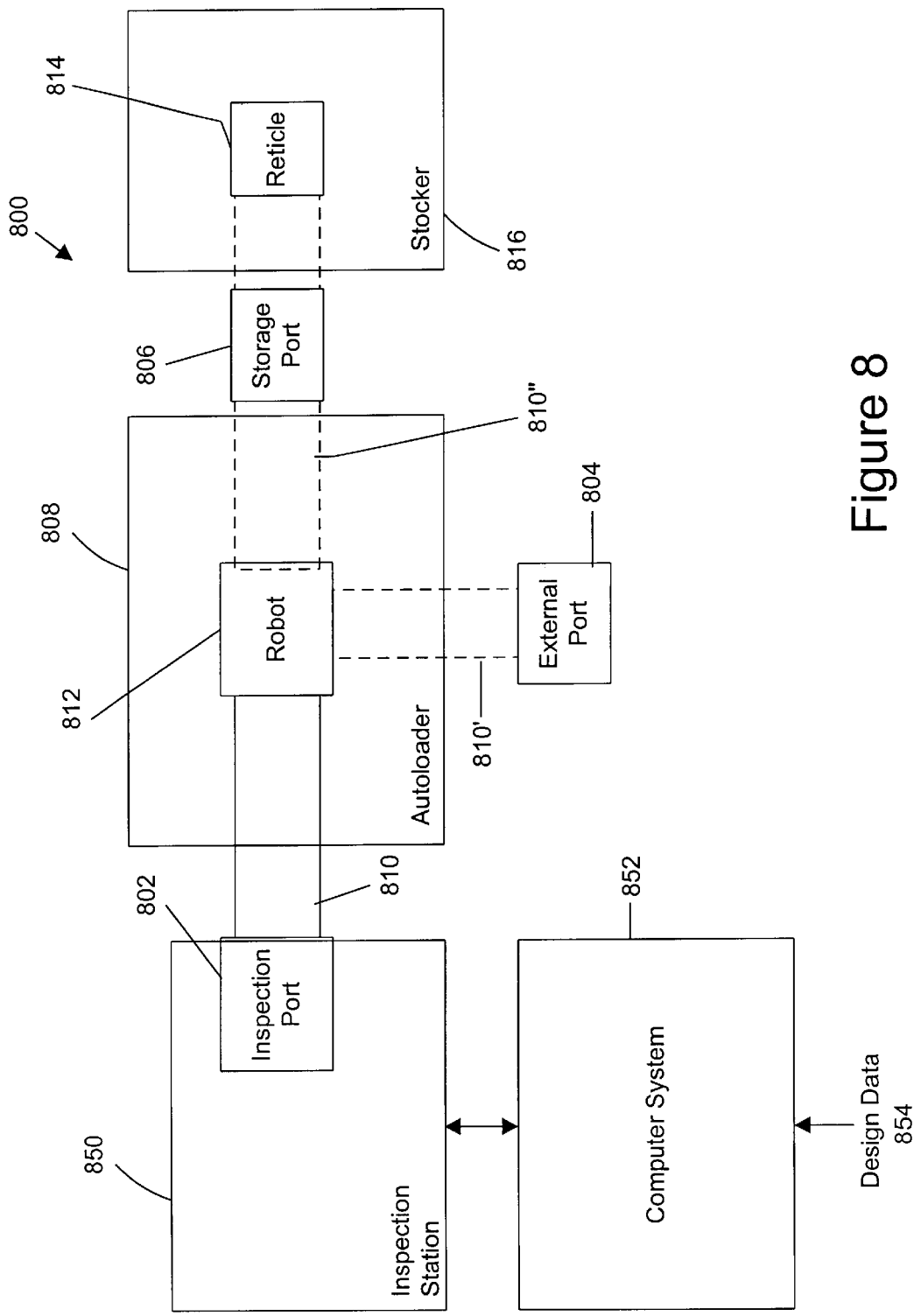
FIG. 8 shows an inspection system in which the simulation and inspection techniques of the present invention may be implemented.

The invention may be used with any suitable inspection or fabrication system. FIG. 8 shows an inspection system 800 in which the simulation and inspection techniques of the present invention may be implemented. An autoloader 808 for automatically transporting reticles or wafers includes a robot 812 having an arm 810 extending towards a inspection port 802 of a reticle or wafer inspection station 850. Arm 810 may rotate and extend towards an external port 804 when in its state denoted by reference number 810'. Similarly, when in its state denoted by reference number 810", the robotic arm can also extend towards a storage port 806 of a reticle stocker station 816 that typically includes several slots or tracks for storing reticles. The robotic arm is designed to further extend and retrieve a reticle or wafer 814 from reticle or wafer stocker station 816.

A typical inspection process, according to one embodiment of the present invention, may begin after reticle or wafer 814 is placed on external port 804, with the intention of storing the reticle or wafer in reticle/wafer stocker station 816 until it is used in a subsequent inspection application, for example. Robotic arm in its position 810' transports the reticle or wafer from external port 804 and stores it in a loading port of reticle/wafer stocker station 816 by extending as shown in FIG. 8. When the reticle or wafer is needed for production, for example, robotic arm 810" retrieves reticle 814 from the loading port and places it on inspection port 802 of reticle or wafer inspection station.

The reticle or wafer inspection station 850 is coupled with a computer system 852 where evaluation process 108 of FIG. 1 detailed above is carried out and it is determined whether the reticle or wafer has passed inspection. The computer system 852 may be integral to reticle/wafer inspection station 850 or separate from the inspection station 850. The reticle/wafer inspection station 850 receives design data 854 in the form of a list of figures, for example. Additionally, the computer system 852 receives image data (i.e., a target or test image) from the inspection station 850. The image data is analyzed by comparing it to a simulated reference image, which may be generated from the design data 854. After the reticle/wafer inspection has concluded, reticle or wafer 814 is placed on external port 804 so that it may be carried to a fabrication facility for use, assuming of course, that it has passed inspection. Alternatively, the reticle or wafer 814 may be repaired or remade.

Suitable computer systems for use in implementing and controlling the methods in the present invention (e.g., controlling the settings of the various scanning apparatus components, generating, storing and retrieving a simulated reference image of the reticle or wafer, storing a test or target image of the reticle or wafer, comparing the test image with the simulated reference image, storing the defects and statistical information during such comparisons, etc.) may be obtained from various vendors (e.g., Silicon Graphics of Mountain View, Calif. or Sun Microsystems of Sunnyvale, Calif.) or custom built by a reticle/wafer inspection system vendor, such as KLA-Tencor.

The term "electronic representation" as used herein covers any machine readable representation. Typically, such representations are stored on magnetic, electronic, or optically readable media. The content of such representations may be transmitted as electrical signals, magnetic signals, electromagnetic signals, optical signals, etc.

Preferably, an optical, electron beam, or other inspection system is integrated with a computer system which implements many of the method steps of this invention. Such composite system preferably includes at least (a) a simulated reference image (preferably compacted) stored in memory, (b) an imaging system arranged to generate an optical or electron beam image of the reticle or wafer, and (c) a processing unit configured to compare the simulated reference and corresponding target images and thereby identify defects, as well as compute and store various statistical information. At a minimum, the imaging system will usually include (i) a source of illumination oriented to direct radiation onto a specified location of the reticle or wafer; and (ii) one or more detectors oriented to detect an image of the reticle or wafer from the source which has been scattered by the reticle or wafer. The imaging system may also include a scanning means.

Although the foregoing invention has been described in some detail for purposes of clarity of understanding, it will be apparent that certain changes and modifications may be practiced within the scope of the appended claims. For example, although in the illustrated embodiments, the reference images are altered to simulate processing and imaging effects, the target image may instead be altered by easily reversing the above described simulation techniques so as to remove processing and imaging effects. Therefore, the described embodiments should be taken as illustrative and not restrictive, and the invention should not be limited to the details given herein but should be defined by the following claims and their full scope of equivalents.

What is claimed is:

1. A method of generating a reference image for an inspection tool, the method comprising:

collecting a plurality of parameters that characterize a process for fabricating a sample;

providing a first reference representation that is designed to be used to fabricate a target structure on the sample;

altering the first reference representation based on the collected parameters so as to produce a second reference representation that simulates process effects from fabricating the sample sufficiently well so as to reduce detection of false defects during a subsequent inspection of the sample using the first reference representation; and altering the second reference representation so as to simulate imaging effect from imaging the second reference representation with the inspection tool, wherein altering the first and second reference representations to simulate process and imaging effects, respectively, results in a simulated reference image that may be compared against the target structure to determine whether the target structure has any defects.

2. A method as recited in claim 1, wherein the first reference representation is altered to simulate process effects by inputting the first reference representation and the collected parameters that characterize a process for fabricating a sample into a process simulation tool which thereafter simulates the process effects by altering the first reference representation.

3. A method as recited in claim 1, further comprising performing an inspection by:

imaging the target structure to obtain a target image;

comparing the simulated reference image to the target image; and when there is a difference between the simulated reference image and the target image, determining that there is a defect present within the target structure.

4. A method as recited in claim 3, wherein the collection of the parameters is performed independently of the comparison.

5. A method as recited in claim 4, wherein the collection of the parameters is performed with a scanning electron microscope and the imaging of the target structure is performed with an optical inspection tool.

6. A method as recited in claim 3, further comprising:

determining whether the collected parameters are within specification;

performing inspection when the collected parameters are within specification and not performing inspection when the collected parameters are not within specification.

7. A method as recited in claim 6, further comprising adjusting the process for fabricating the sample when the collected parameters are not within specification.

8. A method as recited in claim 1, wherein the process effects include feature tapering, corner rounding, and feature shrinkage.

9. A method as recited in claim 8, wherein the process effects further include feature warping and edge roughening.

10. A method as recited in claim 1, wherein the imaging effects are based on one or more imaging parameters selected from a group consisting of numerical aperture of the inspection tool's lens, magnification of the inspection tool's lens, and coherence of the inspection tool's illumination.

11. A method as recited in claim 1, wherein the inspection tool is an optical inspection tool designed to measure and/or inspect samples.

12. A method as recited in claim 1, wherein the sample is selected from a group consisting of a reticle and an integrated circuit and the target structure is selected from a group consisting of an integrated circuit structure, a resist pattern structure utilizable for fabricating an integrated circuit structure, a reticle structure, and a resist pattern structure utilizable for fabricating a reticle structure.

13. A computer system operable generate a reference image for an inspection tool, the computer system comprising:

one or more processors;

one or more memory, wherein at least one of the processors and memory are adapted to:

collect a plurality of parameters that characterize a process for fabricating a sample;

provide a first reference representation that is designed to be used to fabricate a target structure on the sample;

alter the first reference representation based on the collected parameters so as to produce a second reference representation that simulates process effects from fabricating the sample sufficiently well so as to reduce detection of false defects during a subsequent inspection of the sample using the first reference representation; and alter the second reference representation so as to simulate imaging effect from imaging the second reference representation with the inspection tool, wherein altering the first and second reference representations to simulate process and imaging effects, respectively, results in a simulated reference image that may be compared against the target structure to determine whether the target structure has any defects.

14. A computer system as recited in claim 13, wherein the first reference representation is altered to simulate process effects by inputting the first reference representation and the collected parameters that characterize a process for fabricating a sample into a process simulation tool which thereafter simulates the process effects by altering the first reference representation.

15. A computer system as recited in claim 13, wherein the one or more memory, wherein at least one of the processors and memory are further adapted to:

image the target structure to obtain a target image;

compare the simulated reference image to the target image; and when there is a difference between the simulated reference image and the target image, determine that there is a defect present within the target structure.

16. A computer system as recited in claim 15, wherein the collection of the parameters is performed independently of the comparison.

17. A computer system as recited in claim 16, wherein the collection of the parameters is performed with a scanning electron microscope and the imaging of the target structure is performed with an optical inspection tool.

18. A computer system as recited in claim 15, wherein the one or more memory, wherein at least one of the processors and memory are further adapted to:

determine whether the collected parameters are within specification;

perform inspection when the collected parameters are within specification and not perform inspection when the collected para meters are not within specification.

19. A computer system as recited in claim 18, wherein the one or more memory, wherein at least one of the processors and memory are further adapted to adjust the process for fabricating the sample when the collected parameters are not within specification.

20. A computer system as recited in claim 19, wherein the inspection tool is an optical inspection tool designed to measure and/or inspect samples selected from a group consisting of a reticle and an integrated circuit and the structures are selected from a group consisting of integrated circuit structures, resist pattern structures utilizable for fabricating integrated circuit structures, reticle structures, and resist pattern structures utilizable for fabricating reticle structures.

21. A computer system as recited in claim 19, wherein locating the structures on the sample is accomplished by a pixel based search.

22. A computer system as recited in claim 19, wherein locating the structures on the sample is accomplished by finding a first structure on the sample that is significantly correlated with a first one of the second reference images.

23. A computer system as recited in claim 13, wherein the process effects include feature tapering, corner rounding, and feature shrinkage.

24. A computer system as recited in claim 23, wherein the process effects further include feature warping and edge roughening.

25. A computer system as recited in claim 24, wherein the imaging effects are based on one or more imaging parameters selected from a group consisting of numerical aperture of the inspection tool's lens, magnification of the inspection tool's lens, and coherence of the inspection tool's illumination.

26. A computer system as recited in claim 13, wherein the imaging effects are based on one or more imaging parameters selected from a group consisting of numerical aperture of the inspection tool's lens, magnification of the inspection tool's lens, and coherence of the inspection tool's illumination.

27. A computer system as recited in claim 13 that forms part of an optical inspection tool designed to measure and/or inspect samples.

28. A computer system as recited in claim 13, wherein the sample is selected from a group consisting of a reticle and an integrated circuit and the target structure is selected from a group consisting of an integrated circuit structure, a resist pattern structure utilizable for fabricating an integrated circuit structure, a reticle structure, and a resist pattern structure utilizable for fabricating a reticle structure.

29. An inspection system for inspecting a sample, comprising:

an imaging system arranged to generate a target image of the sample; and a computer system as recited in claim 13, wherein the one or more memory, wherein at least one of the processors and memory are further adapted to cause the imaging system to generate the target image of the sample.

30. A computer program product for generating a reference image for an inspection tool, the computer program product comprising:

at least one computer readable medium;

computer program instructions stored within the at least one computer readable product configured to:

collect a plurality of parameters that characterize a process for fabricating a sample;

provide a first reference representation that is designed to be used to fabricate a target structure on the sample;

alter the first reference representation based on the collected parameters so as to produce a second reference representation that simulates process effects from fabricating the sample sufficiently well so as to reduce detection of false defects during a subsequent inspection of the sample using the first reference representation; and alter the second reference representation so as to simulate imaging effect from imaging the second reference representation with the inspection tool, wherein altering the first and second reference representations to simulate process and imaging effects, respectively, results in a simulated reference image that may be compared against the target structure to determine whether the target structure has any defects.

31. A computer program product as recited in claim 30, wherein the first reference representation is altered to simulate process effects by inputting the first reference representation and the collected parameters that characterize a process for fabricating a sample into a process simulation tool which thereafter simulates the process effects by altering the first reference representation.

32. A computer program product as recited in claim 30, the computer program instructions stored within the at least one computer readable product being further configured to perform an inspection by:

imaging the target structure to obtain a target image;

comparing the simulated reference image to the target image; and when there is a difference between the simulated reference image and the target image, determining that there is a defect present within the target structure.

33. A computer program product as recited in claim 32, the computer program instructions stored within the at least one computer readable product being further configured to:

determine whether the collected parameters are within specification;

perform inspection when the collected parameters are within specification and not perform inspection when the collected parameters are not within specification.

34. A computer program product as recited in claim 33, the computer program instructions stored within the at least one computer readable product being further configured to adjust the process for fabricating the sample when the collected parameters are not within specification.

* * * * *